INVENTOR.
TADAO ABE
BY
OSTROLENK, FABER, GERB & SOFFEN
ATTORNEYS

Feb. 9, 1971 TADAO ABE 3,562,742

REVERSIBLE CODE CONVERTER

Filed April 25, 1967 2 Sheets-Sheet 2

INVENTOR.
TADAO ABE

BY
OSTROLENK, FABER, GERB & SOFFEN

ATTORNEYS

United States Patent Office 3,562,742
Patented Feb. 9, 1971

3,562,742
REVERSIBLE CODE CONVERTER

Tadao Abe, Tokyo, Japan, assignor to Nippon Electric Company Limited, Tokyo, Japan Filed Apr. 25, 1967, Ser. No. 633,597
Claims priority, application Japan, May 4, 1966, 41/28,208
Int. Cl. H03k 13/252
U.S. Cl. 340—347 4 Claims

ABSTRACT OF THE DISCLOSURE

A bidirectional code converter incorporating code conversion means for converting codes from a first binary code format to a second binary code format. For example, an N bit binary code format may be converted to a $N+M$ bit binary code format where M may be any number equal to or greater than 1. Settable switch means are provided for permitting code conversion in a first direction, i.e., from any code to an $N+M$ code and which may be reset to provide code conversion in the reverse direction, i.e., from an $N+M$ code to an N code. The settable switch means, when set for code conversion in the first direction inhibits code direction in the reverse direction.

The instant invention relates to code converters and more particularly to a code converter circuit capable of performing reversible code conversion on binary code formats which may be of differing length.

Numerous present day computer and communications applications require the need for code converters wherein it is desired to convert a binary code having a first format into a binary code having a second format differing from the first code format. It is also quite often required, after once having performed the first code conversion operation, to provide converter means for reverting back to the original code format. Present day systems necessitate the need for two separate code converter circuits to perform these code conversions. The number of switching elements required to perform these conversion operations constitute one of the primary drawbacks of present day devices.

The instant invention contemplates a novel reversible code converter which employs a single converter circuit which is utilized in both directions, forward and backward, and which enables an X code form to be converted to a Y code format and conversely, which enables a Y code format to be reversibly converted to an X code form. The reversible code converter circuit of the instant invention is constituted of approximately one-half the number of switching elements utilized in conventional code converters thereby making it an extremely advantageous converter circuitry for a variety of present day applications.

The reversible code converter of the instant invention is comprised of a first input circuit for setting up a code form to be converted. A second input circuit substantially similar to the first input circuit is provided for setting up a binary code which may be of a second code format. A code conversion matrix is provided and is coupled through first and second gating circuits to the first and second input circuits, respectively. Switching means are provided for enabling only one of said first and second input circuits while disabling the remaining input circuit so as to enable code conversion in only one of the two possible directions. First and second output circuits are likewise provided, which output circuits are coupled through first and second output gating circuits to the code conversion matrix. The switching circuit disables that output circuit whose associated input circuit is enabled so as to prevent code conversion in both directions simultaneously. The input and output circuits and the code conversion matrix may be designed so as to enable code conversion between first and second code formats of differing binary lengths.

It is therefore one object of the instant invention to provide a reversible code converter means for converting binary codes of a first code format into binary codes of a second code format and conversely for converting binary codes of the second code format into binary codes of the first code format.

Another object of the instant invention is to provide reversible code converter means including settable switch means which, when set in a first position, enables code conversion from a first binary code format into a second binary code format to be performed and when set into a second position enables code conversion from the second binary code format into the binary code of the first code format to be performed.

Another object of the instant invention is to provide a novel reversible code conversion means comprising a code converter matrix, first and second input circuits for receiving code formats to be converted, first and second gating circuits for respectively connecting the first and second input circuits to the code converter matrix and switching means for enabling only one of said input circuits to be coupled to said code conversion matrix at any given instant.

Still another object of the instant invention is to provide a novel reversible code conversion means comprising a code converter matrix, first and second input circuits for receiving code formats to be converted, first and second gating circuits for respectively connecting the first and second input circuits to the code converter matrix and switching means for enabling only one of said input circuits to be coupled to said code conversion matrix at any given instant and further comprising first and second output circuits coupled to said code conversion matrix through first and second output gating circuits under control of said switch means to enable only one of said output circuits to generate a code format when the associated input circuit is disabled from impressing the code format upon the code conversion matrix.

Still another object of the instant invention is to provide a novel code conversion matrix for converting a binary code from a first code format into a binary code of the second code format and which may be reversibly operated to convert the binary code of the second code format into the binary code of the first code format wherein said first and second binary code formats may be of differing lengths.

These and other objects of the instant invention will become apparent when reading the accompanying description and drawings in which:

FIGS. 1*a* and 1*b* are block diagrams illustrating an example of a conventional code converter.

Figure 1A:
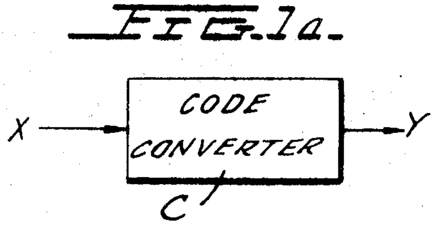
Figure 1B:
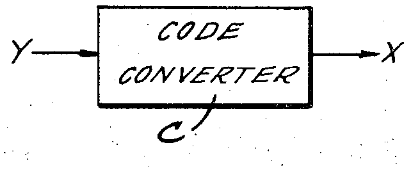

FIGS. 1*a* and 1*b* show conventional code converters in simple block form. In the conventional code converter, if it is desired to convert a code, for example a binary code having a format X into a binary code having a format Y, a code converter as shown in FIG. 1*a* is used. Code converter C is comprised of a code conversion matrix of the type shown in FIG. 3 and to be described in more detail. When a binary code of code format Y is to be converted into a binary code of code format X, a separate code converter such as that shown in FIG. 1*b* must be utilized. This code converter may also be of the matrix form shown in FIG. 3 and to be described in more detail subsequently.

The techniques employed in the FIGS. 1*a* and 1*b* require so many switching elements as to render the size of the equipment too large and tedious, thereby constituting one of the primary drawbacks in the application of the techniques described with respect to FIGS. 1*a* and 1*b*.

Figure 2:
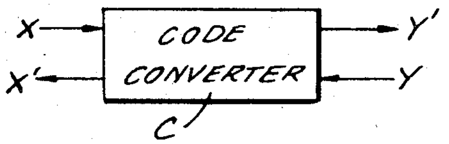
FIG. 2 is a block diagram of the instant invention.

The novel reversible code converter designed in accordance with the principles of the instant invention and shown in simple block diagram form in FIG. 2 is characterized in that a single converter means C is utilized for code conversion in both directions, forward and backward, such that the binary code of format X is converted to a binary code of format Y' and reversibly the binary code of format Y is converted into a binary code of format X'. Utilizing this concept, the reversible code converter of the instant invention may be constituted of about one-half the number of switching elements required in conventional reversible conversion techniques.

Figure 3:
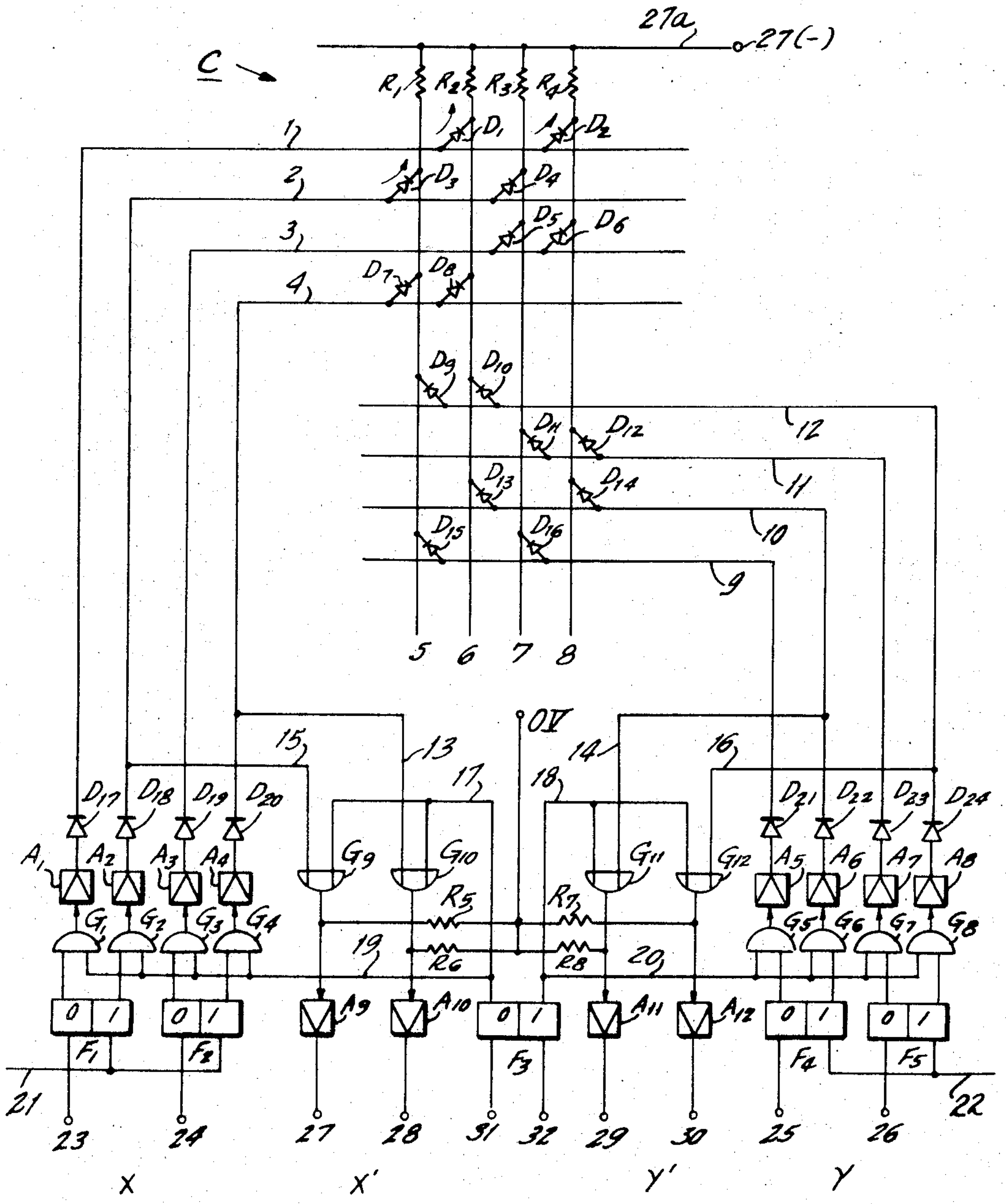
FIG. 3 is a diagram partially in block form and partially in schematic form showing the reversible code converter of the instant invention in greater detail.

FIG. 3 shows an embodiment of the instant invention in greater detail. However, for the purpose of simplifying the explanation there is illustrated therein a reversible code converter for that application in which a two-unit binary code of a first format is converted into the second two-unit binary code of the second format. It should be understood that either or both of the two binary code formats may be constituted of a greater or lesser number of binary bits, depending only upon the particular application involved.

The power source 27 of the embodiment of FIG. 3 is so arranged that the potential bus is approximately at —12 volts relative to reference or ground potential which in this particular embodiment is considered as 0 volts. Thus, the voltage at any part of the circuit is either (—) pottntial or (0) potential due to the bistable operating nature of the circuitry.

Observing the embodiment of FIG. 3 still further, there is shown therein a plurality of diodes $D_1$–$D_{24}$, gate resistors $R_1$–$R_4$ and transistor type switching amplifiers $A_1$–$A_8$. The inputs for the amplifiers $A_1$–$A_8$ are applied as indicated by the arrow heads and the outputs from the amplifiers are obtained at the other side of the amplifier blocks with the magnitudes of the potentials always being inverted in passing through the amplifier circuit, or specifically, when (—) potential is applied to input terminal of any transistor type switching amplifier, the outputs obtained are all at (0) potential and if a (0) potential is applied to any one of their input terminals, the outputs obtained are all of (—) potential.

Figure 4:
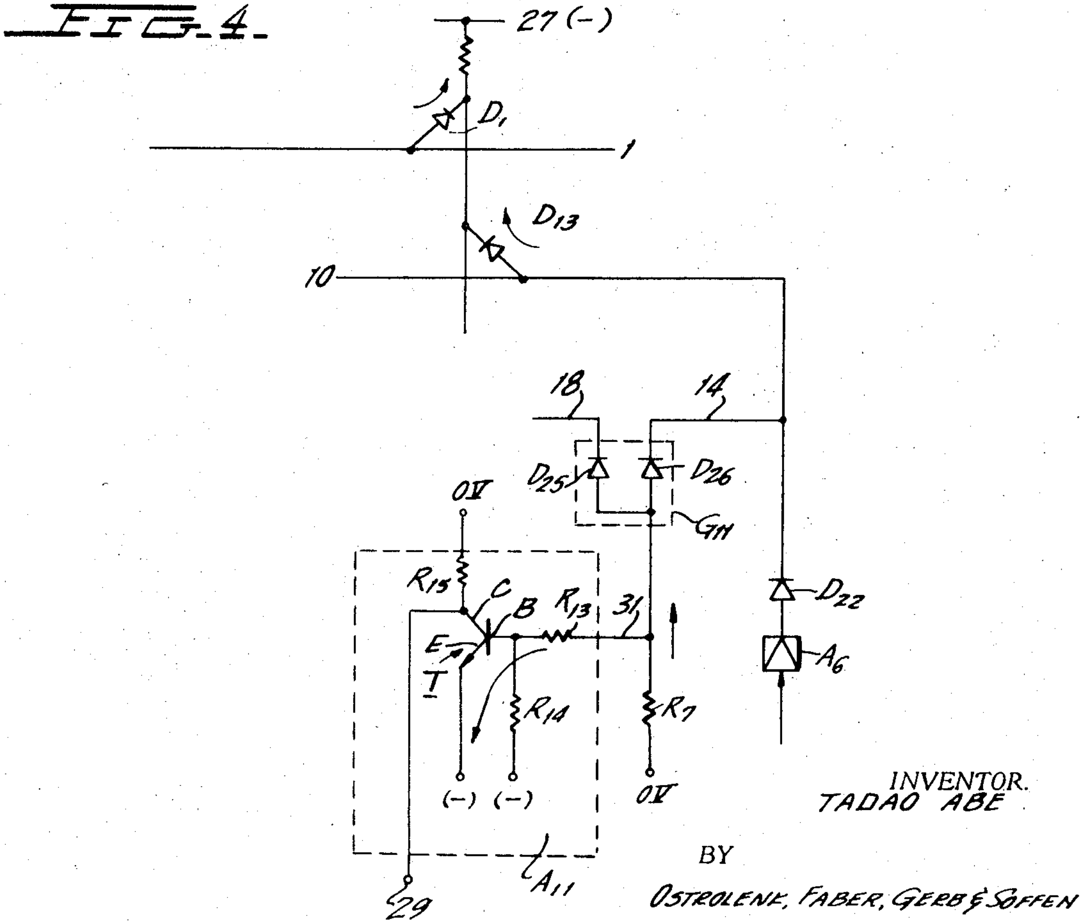
FIG. 4 is a schematic diagram illustrating the operation for a portion of the code converter circuit of FIG. 3.

The transistor amplifiers $A_9$–$A_{12}$ of FIG. 3 shown in block form are shown in greater detail and schematic form in FIG. 4. Only one of these transistor type switching amplifiers ($A_{11}$) is shown in FIG. 4 for purposes of simplicity, it being understood that amplifiers $A_9$, $A_{10}$ and $A_{12}$ are substantially similar thereto.

Considering FIG. 4, when line 18 is at (—) potential, the current flows through the line 18, diode $D_{25}$ of gate $G_{11}$ and the resistor $R_7$ to ground or (0) potential. Accordingly, line 31 which is coupled to the ungrounded terminal of resistor $R_7$ has a (—) potential relative to ground which back-biases the NPN transistor T of the amplifier at base electrode B placing transistor T in cut off condition so that its output terminal 29 is maintained at (0) potential. On the other hand, when line 18 is at (0) potential), and if line 14 is not a (—) potential (i.e.,) line 14 is at (0) potential), the current flows from ground through resistor $R_7$, resistor $R_{13}$ and resistor $R_{14}$ to (—) potential to pass through resistor $R_{14}$ and bypass through the base to emitter circuit of transistor T due to its forward-bias condition at this time so that the transisor T is driven into the ON state. With transistor T in the ON state, output terminal 29 is maintained at the (—) potential, since transistor T in the ON state may be considered to be effectively a shortcircuit between its emitter and collector terminals E and C, respectively.

Transistor amplifiers $A_9$–$A_{12}$ of FIG. 3 are constructed in the same manner as amplifier $A_{11}$ shown in FIG. 4 and, when either of the lines 18 and 17 are at (0) potential, the binary states of the information at the lines 13–15 and 14–16 are reversed in polarity when they appear at their respective output lines 27–28 and 29–30.

Gates $G_1$–$G_8$ of FIG. 3 are all AND gates so that a (—) potential is obtained at their output terminals only when the two input terminals for each AND gate are simultaneously at (—) potential. As is customary with AND gates of this type, if either or both of the input terminals of each AND gate are at (0) potential, the output of each AND gate will be at (0) potential.

$G_9$–$G_{12}$ represents OR gates such that their input terminals will be at (—) potential when either or both of their input terminals are at (—) potential.

$F_1$, $F_2$, $F_4$ and $F_5$ are set and reset (bistable) flip-flops such that when each of their input terminals 23, 24, 25 and 26, respectively, is coupled to (—) potential, the output line of its "1" side is driven to (—) potential and remains in this state until a reset operation is performed. Simultaneously therewith the output line on the "0" side of the flip-flop is driven to the (0) potential and remains in this state until the performance of a reset operation.

Flip-flops $F_1$, $F_2$, $F_4$ and $F_5$ may be reset by the application of (—) potential to reset buses 21 and 22 causing the output lines on the "0" sides of these flip-flops to go to (—) potential and simultaneously therewith causing the output terminals of their "1" sides to go to (0) potential and to remain in these states indefinitely or at least until the receipt of another (—) potential at any of their input terminals 23–26, respectively.

$F_3$ designates a transfer flip-flop employed for switching purposes to be more fully described. The operation of flip-flop $F_3$ is such that if terminal 31 receives (—) potential, then (—) potential appears at the output terminal on the "1" side of the flip-flop and (0) potential appears at the output terminal of the "0" side of he flip-flop. Conversely, if (—) potential is applied to terminal 32, (—) and (0) potentials appear at the output terminals of the "0" and "1" sides of the flip-flop respectively.

FIG. 3 illustrates an embodiment of the reversible code converter in accordance with the present invention where a 2 unit binary code having a format X represented by (0, 0), (1, 0), (0, 1), and (1,1) is converted to Y' code format (1, 0), (0,0), (1, 1), and (0, 1) respectively, and alternatively where Y code format (1, 0), (0, 0), (1, 1), and (0, 1) is converted into X' code format (0, 0), (1, 0), (0, 1), and (1, 1) respectively. For purposes of facilitating the description of the invention it is assumed that (0, 0) denotes the case in which the first bit and the second bit of the 2 unit code are both (0), that is, they are equal to the ground potential, and (1, 0) denotes that the first bit of the 2 unit code is 1 and the second bit is 0. Here 1 represents the (—) potential. It is also supposed that X, X' codes and Y, Y' codes respectively represent the same codes, whereas, X, Y are the codes to be converted and X', Y' are their respective converted forms.

Now, for the simplification of the explanation, a case will be considered in which X code (0, 1) is converted to Y' code (1, 1) and Y code (1, 1) is reversibly converted to X' code (0, 1).

In the former case where X code (0, 1) is converted to Y' code (1, 1), if (—) potential is applied from peripheral circuitry (not shown) to the input terminal 32 of the flip-flop $F_3$ as shown in FIG. 3 for the purpose of transferring the gate circuit, then (—) potential will appear at the output lines 17 and 19 of the flip-flop $F_3$ and (0) potential will appear at the output lines 18, 20. This state is maintained until the next transferring signal (of (—) potential) is applied to the input terminal 31 of the flip-flop $F_3$.

When the output lines 17, 19 of the flip-flop $F_3$ are at (—) potential, AND gates $G_1$–$G_4$ are enabled, allowing the output information from the flip-flops $F_1$ and $F_2$ to be passed to the transistor amplifiers $A_1$–$A_4$ through the AND gates $G_1$–$G_4$. Amplifiers $A_1$–$A_4$ (as previously described) invert the states of the information emitted from the gates $G_1$–$G_4$ respectively, and thereby furnish the inverted binary states to a matrix conversion circuit. At the same time, OR gates $G_9$, $G_{10}$ pass the (—) potential from the line 17 to their output lines, causing (—) potential to be applied to the input terminals of the transistor switching amplifier $A_9$, $A_{10}$ regardless of the binary states of the output information appearing on the output lines 13, 15 of the matrix signal conversion circuit. Thus, (0) potential is obtained at the output terminals 27, 28 of the amplifiers $A_9$ and $A_{10}$. Since (0, 0) is a valid code format, suitable indicator lamps (not shown) may be coupled to the outputs of F, (through suitable buffer circuits) to indicate the direction of code conversion.

On the other hand, since the output lines 18, 20 from the flip-flop $F_3$ are at (0) potential, AND gates $G_5$–$G_8$ are closed (i.e. disabled), and the input voltage of the amplifiers $A_5$–$A_8$ are always at (0) potential regardless of the output information from the flip-flops $F_4$, $F_5$ since gates $G_5$–$G_8$ block the output levels appearing at flip-flops $F_4$ and $F_5$ from being passed to amplifiers $A_5$–$A_8$, respectively.

Outputs from the transistor amplifiers $A_5$–$A_8$ are respectively connected to the matrix signal conversion circuit through diodes $D_{21}$–$D_{24}$. Hence, the diodes $D_{21}$–$D_{24}$ act as resistors of very high resistance (i.e. back biased diodes) and the information on the flip-flops $F_4$, $F_5$ do not affect the operation of the matrix circuit.

Since the line 18 is at (0) potential, the information on the lines 14, 16 connected with the matrix signal conversion circuit passes through the OR gates $G_{11}$, $G_{12}$ without any change and are applied to the input side of the transistor amplifiers $A_{11}$, $A_{12}$ and thus the inverted information to those for the lines 14, 16 will be obtained at the output terminals 29 and 30 of the amplifiers $A_{11}$, $A_{12}$, respectively. Thus, the 2 unit code format X read-in from the terminals 23, 24 is converted in the matrix conversion circuit and the Y′ code format is obtained at the output terminals 29, 30.

Let it be assumed that flip-flop $F_1$ stores the first bit of the X code format and flip-flop $F_2$ stores the second bit of the X code format. After application of (—) potential at the reset terminal 21, X code (0, 1) is applied to the input terminals 23, 24. Upon application of the appropriate voltage levels the flip-flop $F_1$ stays in the existing state (i.e., reset state) and (—) potential is obtained at "0" side output line. The flip-flop $F_2$, however, is inverted and the "1" side output line is brought to (—) potential. As a result, the outputs of the flip-flops $F_1$, $F_2$ enter the amplifiers $A_1$–$A_4$, through the enabled AND gates $G_1$–$G_4$ so that the output lines of the respective amplifiers will be at (0), (—), (—) and (0) potential respectively.

Since the output lines of the amplifiers $A_1$ and $A_4$ at (0) potential can pass through their associated diodes ($D_{17}$ and $D_{20}$), line 1 and line 4 (the lines connecting amplifiers $A_1$–$A_4$ to the code converting matrix) are maintained at (0) potential, and lines 2 and line 3 are maintained at (—) potential. These voltage levels cause a current to flow through diode $D_1$ and gate resistor $R_2$, to (—) source 27, maintaining line 6 at (0) potential. In the same way, the line 8 is also maintained at (0) potential. Since the line 4 is also at (0) potential, a current flows through the diode $D_7$, gate resistor $R_1$ to (—) source 27, and the lines 4 and 5 are brought to (0) potential. At this time the potential of the line 6 determined through the diode $D_8$ from the line 4 will be at (0) potential.

Lines 2 and 3 are now at (—) potential, and because both ends of the diodes $D_3$–$D_4$ and $D_5$–$D_6$ are at about the same potential, no current flows through those diodes and only the line 7 will be at (—) potential. Since the line 7 is at (—) potential diodes $D_{11}$, $D_{16}$ conduct, placing the lines 9, 11 at (—) potential. However, due to the fact that the lines 9, 11 are not conducting to the amplifiers $A_{11}$, $A_{12}$, these voltage levels have no effect on the output of these amplifiers.

Lines 10, 12 are connected with the lines 5, 6, 8 through the diodes $D_9$, $D_{10}$, $D_{13}$, $D_{14}$. Since the lines 5, 6, 8 are all at (0) potential, these lines will be at (0) potential, and the input terminals of the output transistor amplifiers also will be at almost (0) potential through the input gate resistors $R_7$, $R_8$. Thus, the input terminals of the amplifiers $A_{11}$, $A_{12}$ are at (0) potential causing a current to flow through the transistor circuit. This brings the transistor circuits to the ON (i.e., conductive) state and (—) potential appears on the terminals 29, 30.

This means that X code (0, 1) is converted to Y′ code (1, 1).

In order to perform reverse code conversion (—) potential is applied to the input terminal 31 of the flip-flop $F_3$, so that the output lines 18, 20 are brought to (—) potential and output lines 17, 19 are brought to (0) potential. Hence in the same manner as stated before, a 2 unit code read-in from the input terminals 25, 26 is converted by means of the matrix converting circuit and the outputs are obtained at the output terminals 27, 28.

In this condition, if Y code (1, 1) is applied at the input terminals 25, 26, lines 9, 11 are brought to (—) potential and the lines 10, 12 are brought to (0) potential. As a result of this, lines 6, 8 connected with the line 10 through diodes $D_{13}$, $D_{14}$ are brought to (0) potential. Also the lines 5, 6 connected with the line 12 through $D_9$, $D_{10}$ are brought to (0) potential.

Since the lines 9, 11 are at (—) potential, line 7 connected through $D_{11}$, $D_{16}$ will be at (—) potential and the lines 2, 3 connected with the line 7 through diodes $D_4$, $D_5$ will be (—) potential. Accordingly, at the output terminal of the output amplifier $A_9$ connected with the line 2 a reversed potential (0) will be obtained (due to the amplifier inversion action previously described).

Because the lines 5, 6, 8 are all at (0) potential the line 4 will also be at (0) potential, and a reversed potential (—) will be obtained at the output terminal of the output amplifier $A_{10}$. Thus the Y code (1, 1), which is applied to the input lines, is converted to X′ code (0, 1). Although a process to convert X code (0, 1) to Y′ code (1, 1) and Y code (1, 1) to X′ code (0, 1) was described above, it is apparent that any other 2 unit code can also be converted in a similar manner.

As was described above, the gist of the present invention resides in a reversible code converter wherein a matrix code conversion circuit is utilized in a reversible manner. Although the conversion of 2 unit code of a first format to another 2 unit code of a second format has been described in detail herein, it is to be understood that the present invention is not limited to codes of 2 unit length, but can be applied to any number unit code, for instance, a 6 unit code can be converted to other any unit code, for example, an 8 unit code and, conversely, an 8 unit code can be converted to a 6 unit code.

Although there has been described a preferred embodiment of this novel invention, many variations and modifications will now be apparent to those skilled in the art. Therefore, this invention is to be limited, not by the specific disclosure herein, but only by the appending claims.

What is claimed is:

1. Reversible code conversion means comprising:
   a code conversion matrix having first and second groups of reversible input-output lines;
   first and second input means;
   first and second output means;
   first and second input gating means respectively coupling said first and second input means to said first and second groups of reversible input-output lines;

first and second output gating means respectively coupling said first and second output means to said first and second groups of reversible input-output lines;

two position switching means coupled to said first and second input gating means and said first and second output gating means for enabling only said first input gating means and said second output gating means when in a first position and for enabling only said second input gating means and said first output gating means when in a second position to control the direction of code conversion;

said first and second input means each being comprised of N bistable circuits for storing a binary code of a bit length B where $B \leq N$;

said first and second input gating means each being comprised of a plurality of AND gates selectively enabled by said switch means for coupling the outputs of said bistable circuits to associated input-output lines of said matrix.

2. The conversion means of claim 1 wherein said first and second input gating means are further comprised of a plurality of amplifier means for amplifying and inverting the outputs of associated AND gates prior to impressing the inverted states upon their associated matrix input-output lines.

3. The code conversion means of claim 1 wherein said first and second output gating means are each comprised of a plurality of OR gates each being coupled to one output of said switching means and an associated one of said matrix input-output line groups for generating the converted code representative of the input code to be converted;

said first and second output gating means being further comprised of a plurality of amplifiers for amplifying and inverting the outputs of an associated OR gate.

4. The code conversion of claim 1 further comprising third and fourth groups of diode means; each of said groups being coupled to an associated matrix input-output line and an associated input gate amplifier to block the information from said matrix from being applied to one of said first and second input gating means when the other of said first and second input gating means is enabled.

References Cited

UNITED STATES PATENTS

| | | | |
|---|---|---|---|
| 2,633,498 | 3/1953 | Schneckloth | 179—18 |
| 2,912,511 | 11/1959 | McKim | 179—18 |
| 2,922,996 | 1/1960 | Young Jr. | 179—18 |
| 3,064,894 | 11/1962 | Campbell | 235—155 |
| 3,156,898 | 11/1964 | Avery et al. | 340—347X |
| 3,235,664 | 2/1966 | Muroga et al. | 340—347X |
| 3,241,134 | 3/1966 | Looschen | 340—347 |
| 3,333,261 | 7/1967 | Basset | 340—347 |

OTHER REFERENCES

J. W. Haskell, Bilateral Translator, September 1961, vol. 4, No. 4, page 13, IBM Technical Disclosure Bulletin.

MAYNARD R. WILBUR, Primary Examiner

C. D. MILLER, Assistant Examiner

U.S. Cl. X.R.

179—18